United States Patent
Yang

(10) Patent No.: US 8,004,320 B2
(45) Date of Patent: Aug. 23, 2011

(54) FREQUENCY SYNTHESIZER, FREQUENCY PRESCALER THEREOF, AND FREQUENCY SYNTHESIZING METHOD THEREOF

(75) Inventor: Tzu-Cheng Yang, Taipei County (TW)

(73) Assignee: Novatek Microelectronics Corp., Hsinchu (TW)

( * ) Notice: Subject to any disclaimer, the term of this patent is extended or adjusted under 35 U.S.C. 154(b) by 194 days.

(21) Appl. No.: 12/270,860

(22) Filed: Nov. 14, 2008

(65) Prior Publication Data

US 2010/0085085 A1 Apr. 8, 2010

(30) Foreign Application Priority Data

Oct. 3, 2008 (TW) ................................ 97138272 A

(51) Int. Cl.
*H03B 19/00* (2006.01)
(52) U.S. Cl. .......... 327/117; 327/113; 327/115; 377/47; 377/48
(58) Field of Classification Search .................. 327/113, 327/115, 117, 118; 377/47, 48
See application file for complete search history.

(56) References Cited

U.S. PATENT DOCUMENTS

| | | | | |
|---|---|---|---|---|
| 6,570,946 | B1 * | 5/2003 | Homol et al. | 375/371 |
| 7,075,350 | B2 * | 7/2006 | Austin et al. | 327/208 |
| 7,113,009 | B2 * | 9/2006 | Sun et al. | 327/115 |
| 7,492,852 | B1 * | 2/2009 | Liu | 377/48 |

* cited by examiner

*Primary Examiner* — Lincoln Donovan
*Assistant Examiner* — Colleen O'Toole
(74) *Attorney, Agent, or Firm* — Jianq Chyun IP Office

(57) ABSTRACT

A frequency synthesizer is provided, including a voltage-controlled oscillator (VCO), a frequency prescaler, a divide-by-2.5 circuit, and a selector. The VCO determine the frequency of a first signal according to an input voltage. The frequency prescaler determines the frequency of a second signal to be the frequency of the first signal divided by 3, 3.5, or 4 according to a first selection signal, and the frequency prescaler also determines the frequency of a third signal to be the frequency of the first signal divided by 6, 7, or 8 according to the first selection signal. The divide-by-2.5 circuit generates a fourth signal, wherein the frequency of the fourth signal is the frequency of the first signal divided by 2.5. The selector selects one of the second signal, the third signal, and the fourth signal as a fifth signal according to a second selection signal.

2 Claims, 8 Drawing Sheets

FREQUENCY SYNTHESIZER, FREQUENCY PRESCALER THEREOF, AND FREQUENCY SYNTHESIZING METHOD THEREOF

CROSS-REFERENCE TO RELATED APPLICATION

This application claims the priority benefit of Taiwan application serial no. 97138272, filed on Oct. 3, 2008. The entirety of the above-mentioned patent application is hereby incorporated by reference herein and made a part of this specification.

BACKGROUND OF THE INVENTION

1. Field of the Invention

The present invention generally relates to a frequency synthesizer, a frequency prescaler thereof, and a frequency synthesizing method thereof, and more particularly, to a frequency synthesizer with low circuit complexity, low power consumption, and broad bandwidth, a frequency prescaler thereof, and a frequency synthesizing method thereof.

2. Description of Related Art

A frequency synthesizer is a device for outputting signals of different frequencies, and is usually applied in the tuner of a broadband communication receiver. When the communication receiver needs to generate signals of different frequencies, the frequency synthesizer provides a high-frequency signal S1 and several signals S2~SK of lower frequencies, wherein the frequency of the signal S1 is multiples of the frequencies of the signals S2~SK.

FIG. 1 is a system block diagram of a conventional frequency synthesizer 10. Referring to FIG. 1, the conventional frequency synthesizer 10 includes at least two voltage-controlled oscillators (VCOs) 101 and 102, selectors 103 and 106, a divide-by-3.5 circuit 104, divide-by-2 circuits 105, 107, and 109, and an orthogonal signal separator 108.

The VCOs 101 and 102 are two different VCOs. The VCOs 101 and 102 receive an input voltage Vin and output signals of different frequencies according to the input voltage Vin. The selector 103 is coupled to the VCOs 101 and 102, and selects an output signal of the VCOs 101 and 102 as its output signal. Through the operations of the VCOs 101 and 102 and the selector 103, the selector 103 can output a signal having frequency between 1.8 GHz and 3.3 GHz.

The divide-by-3.5 circuit 104 is coupled to the selector 103 for dividing the frequency of the output signal of the selector 103 by 3.5. The divide-by-2 circuit 105 is coupled to the divide-by-3.5 circuit 104 for dividing the frequency of the output signal of the divide-by-3.5 circuit 104 by 2. Through the operations of the divide-by-2 circuit 105 and the divide-by-3.5 circuit 104, the frequency of the output signal of the selector 103 can be divided by 7.

The selector 106 is coupled to the divide-by-2 circuit 105, the divide-by-3.5 circuit 104, and the selector 103. The selector 106 selects one of the output signals of the divide-by-2 circuit 105, the divide-by-3.5 circuit 104, and the selector 103 as its output signal. In other words, the selector 106 can choose to divide the frequency of the output signal of the selector 103 by 7, 3.5, or to directly output the output signal of the selector 103.

The divide-by-2 circuit 107 is coupled to the selector 106 for dividing the frequency of the output signal of the selector 106 by 2. The orthogonal signal separator 108 generates an orthogonal signal corresponding to the output signal of the divide-by-2 circuit 107 and outputs the output signal of the divide-by-2 circuit 107 and the corresponding orthogonal signal. The divide-by-2 circuit 109 is coupled to the orthogonal signal separator 108 for dividing the frequency of the output signal of the orthogonal signal separator 108 by 2, so as to output two signals Vout_I and Vout_Q, wherein the output signals Vout_I and Vout_Q have the same frequency but the phases thereof have a difference of 90°, and the frequency of the output signals Vout_I and Vout_Q is between 90 MHz and 770 MHz.

The conventional frequency synthesizer 10 requires at least two VCOs 101 and 102, and the VCOs 101 and 102 have larger chip sizes than other components. Accordingly, the chip size of the conventional frequency synthesizer 10 is too large to meet the current trend in the design of electronic products. Besides, the large chip size of the conventional frequency synthesizer 10 makes it very difficult to reduce the fabricating cost.

FIG. 2 is a system block diagram of another conventional frequency synthesizer 20. Referring to FIG. 2, the conventional frequency synthesizer 20 includes a VCO 201, a frequency prescaler 202, a duty cycle corrector (DCC) 203, a multiply-by-2 circuit 204, a frequency divider 205, and a divide-by-2 circuit 206.

The VCO 201 receives an input voltage Vin and generates an output signal having frequency between 7.1 GHz and 8 GHz according to the input voltage Vin. The frequency prescaler 202 is coupled to the VCO 201 for dividing the frequency of the output signal of the VCO 201 by 8 to 15. The DCC 203 is coupled to the frequency prescaler 202 for correcting the output signal of the frequency prescaler 202. The multiply-by-2 circuit 204 is coupled to the DCC 203 for multiplying the frequency of the output signal of the DCC 203 by 2. Through the operations of the DCC 203 and the multiply-by-2 circuit 204, the corrected output signal can have a 50% duty cycle.

The frequency divider 205 is a power-of-2 frequency divider. The frequency divider 205 is coupled to the multiply-by-2 circuit 204 for dividing the frequency of the output signal of the multiply-by-2 circuit 204 by 1, 2, 4, 8, or 16. The divide-by-2 circuit 206 is coupled to the frequency divider 205 for dividing the frequency of the output signal of the frequency divider 205 by 2, so as to generate an output signal Vout.

Since the conventional frequency synthesizer 20 adopts only one VCO 201, the chip size thereof is smaller than that of the conventional frequency synthesizer 10. However, since only one VCO 201 is adopted for achieving the desired frequency range, the frequency of the output signal of the VCO 201 is between 7.1 GHz and 8 GHz. The higher the frequency of the output signal of the VCO 201 is, the more power is consumed by the VCO 201 and the higher circuit complexity the VCO 201 has.

The multiply-by-2 circuit 204 and the DCC 203 have to be disposed in the conventional frequency synthesizer 20 in order to allow the output signal of the frequency synthesizer 20 to have a 50% duty cycle. However, the adoption of the multiply-by-2 circuit 204 and the DCC 203 increases the complexity of the conventional frequency synthesizer 20. Because the frequency prescaler 202 cannot operate with a high-frequency VCO, the frequency of the output signal of the VCO 201 is usually reduced by half. Then the desired frequency of the output signal is obtained through the multiply-by-2 circuit 204. Besides, the frequency divider 205 usually has four divide-by-2 circuits in order to obtain different frequencies. As a result, including the divide-by-2 circuit 206, the frequency synthesizer 20 requires totally five divide-by-2 circuits.

SUMMARY OF THE INVENTION

Accordingly, the present invention is directed to a frequency synthesizer, wherein only one voltage-controlled oscillator (VCO) is adopted so that the chip size of the frequency synthesizer is reduced.

The present invention is also directed to a frequency prescaler suitable for a frequency synthesizer, wherein the frequency synthesizer can divide the frequency of an input signal thereof by 3, 3.5, 4, 6, 7, and 8.

The present invention is further directed to a frequency synthesizing method, wherein a frequency synthesizer adopting the frequency synthesizing method requires only one VCO so that the chip size of the frequency synthesizer is reduced.

The present exemplary embodiment of the present invention provides a frequency synthesizer including a VCO, a frequency prescaler, a divide-by-2.5 circuit, and a first selector. The VCO determines the frequency of a first signal according to an input voltage and outputs the first signal. The frequency prescaler is coupled to the VCO. The frequency prescaler determines the frequency of a second signal to be the frequency of the first signal divided by 3, 3.5, or 4 according to a first selection signal, and the frequency prescaler also determines the frequency of a third signal to be the frequency of the first signal divided by 6, 7, or 8 according to the first selection signal, and the frequency prescaler outputs the second signal and the third signal. The divide-by-2.5 circuit is coupled to the VCO and generates a fourth signal, wherein the frequency of the fourth signal is the frequency of the first signal divided by 2.5. The first selector is coupled to the frequency prescaler and the divide-by-2.5 circuit, and the first selector determines a fifth signal to be the second signal, the third signal, or the fourth signal according to a second selection signal.

The present exemplary embodiment of the present invention also provides a frequency prescaler suitable for a frequency synthesizer. The frequency prescaler includes a first D flip-flop, a second D flip-flop, a first multiplexer, a third D flip-flop, a fourth D flip-flop, and a second multiplexer. A clock signal positive input terminal of the first D flip-flop receives a positive signal of a first signal, and a clock signal negative input terminal of the first D flip-flop receives a negative signal of the first signal. A clock signal negative input terminal of the second D flip-flop receives the positive signal of the first signal, and a clock signal positive input terminal of the second D flip-flop receives the negative signal of the first signal. A first positive input terminal and a second positive input terminal of the first multiplexer are respectively coupled to a plurality of positive output terminals of the first D flip-flop and the second D flip-flop, a first negative input terminal and a second negative input terminal of the first multiplexer are respectively coupled to a plurality of negative output terminals of the first D flip-flop and the second D flip-flop, a first positive output terminal of the first multiplexer is coupled to a plurality of positive input terminals of the first D flip-flop and the second D flip-flop, and a first negative output terminal of the first multiplexer is coupled to a plurality of negative input terminals of the first D flip-flop and the second D flip-flop. A clock signal positive terminal and a clock signal negative terminal of the third D flip-flop are respectively coupled to a level shift positive output terminal and a level shift negative output terminal of the first multiplexer, a positive output terminal of the third D flip-flop is coupled to a negative input terminal of the third D flip-flop, a negative output terminal of the third D flip-flop is coupled to a positive input terminal of the third D flip-flop, and a level shift positive output terminal and a level shift negative output terminal of the third D flip-flop are respectively coupled to a first negative output terminal and a first positive output terminal of the frequency prescaler. A clock signal positive terminal and a clock signal negative terminal of the fourth D flip-flop are respectively coupled to the level shift positive output terminal and the level shift negative output terminal of the third D flip-flop, a positive output terminal and a negative input terminal of the fourth D flip-flop are respectively coupled to the negative input terminal and a positive input terminal of the fourth D flip-flop, and a level shift positive output terminal and a level shift negative output terminal of the fourth D flip-flop are respectively coupled to a second positive output terminal and a second negative output terminal of the frequency prescaler. A first positive input terminal and a first negative input terminal of the second multiplexer are respectively coupled to a high-level voltage and a low-level voltage, a second positive input terminal and a second negative input terminal of the second multiplexer are respectively coupled to the level shift negative output terminal and the level shift positive output terminal of the third D flip-flop, and a third positive input terminal and a third negative input terminal of the second multiplexer are respectively coupled to the level shift negative output terminal and the level shift positive output terminal of the fourth D flip-flop. Wherein, the first multiplexer is controlled by a first different control signal, the second multiplexer determines the first differential control signal according to a second different control signal, and outputs the first differential control signal.

The present exemplary embodiment of the present invention further provides a frequency synthesizing method. The frequency synthesizing method includes: (1) receiving a control voltage and generating a first signal, wherein the frequency of the first signal is determined by the control voltage; (2) generating a second signal and a third signal, wherein the frequencies of the second signal and the third signal are determined according to a first selection signal, the frequency of the second signal is the frequency of the first signal divided by 3, 3.5, or 4, and the frequency of the third signal is the frequency of the first signal divided by 6, 7, or 8; (3) generating a fourth signal, wherein the frequency of the fourth signal is the frequency of the first signal divided by 2.5; and (4) selecting one of the second signal, the third signal, and the fourth signal as a fifth signal according to a second selection signal.

Accordingly, the present exemplary embodiment of the present invention provides a frequency synthesizer, a frequency prescaler thereof, and a frequency synthesizing method thereof, wherein the frequency synthesizer offers smaller chip size, lower fabricating cost, and lower power consumption compared to the conventional frequency synthesizers. In addition, because no duty cycle corrector (DCC) or multiply-by-2 circuit is disposed in the frequency synthesizer provided by the exemplary embodiment of the present invention, the circuit complexity of the frequency synthesizer provided by the exemplary embodiment of the present invention is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
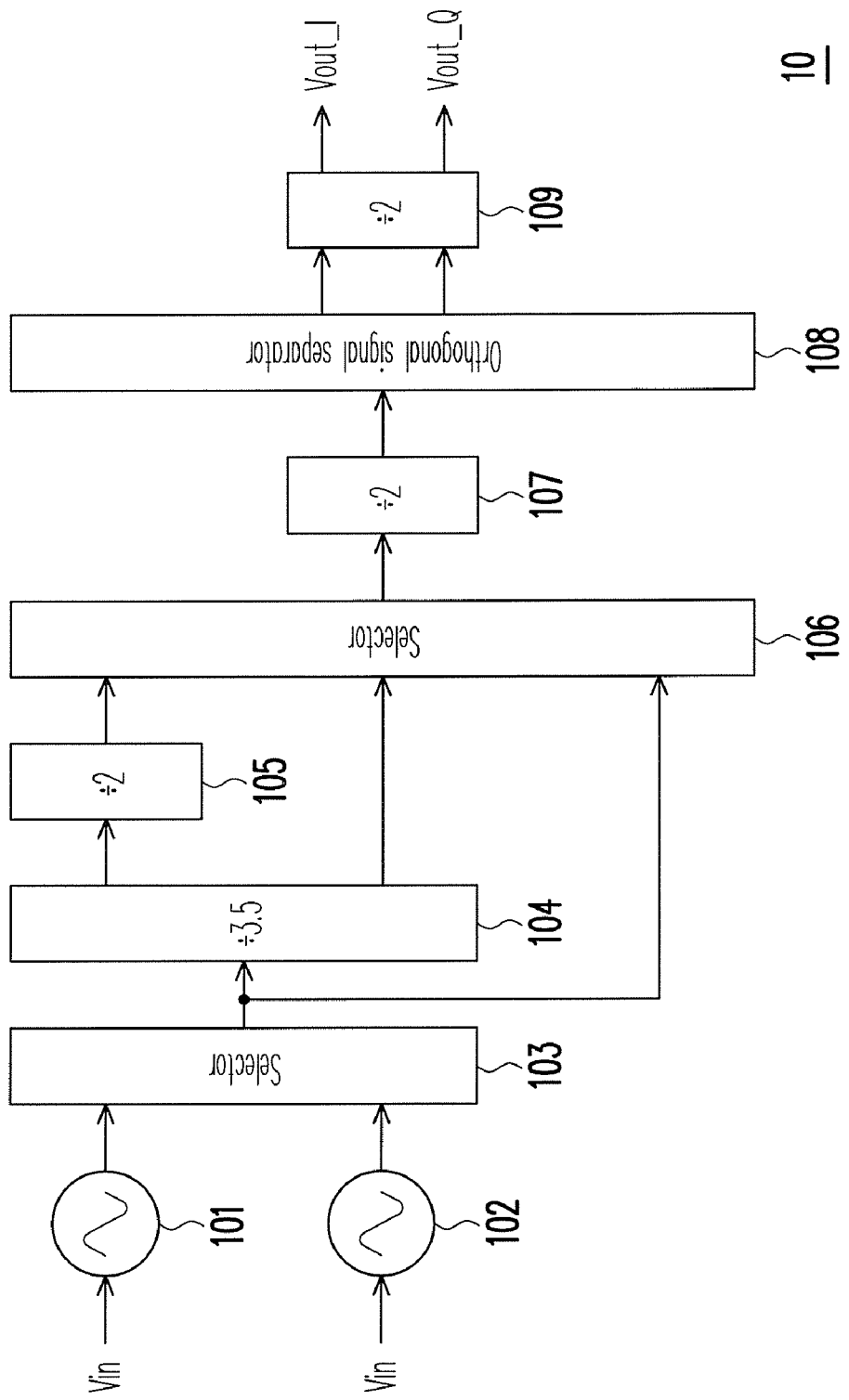
FIG. 1 is a system block diagram of a conventional frequency synthesizer 10.
Figure 2:
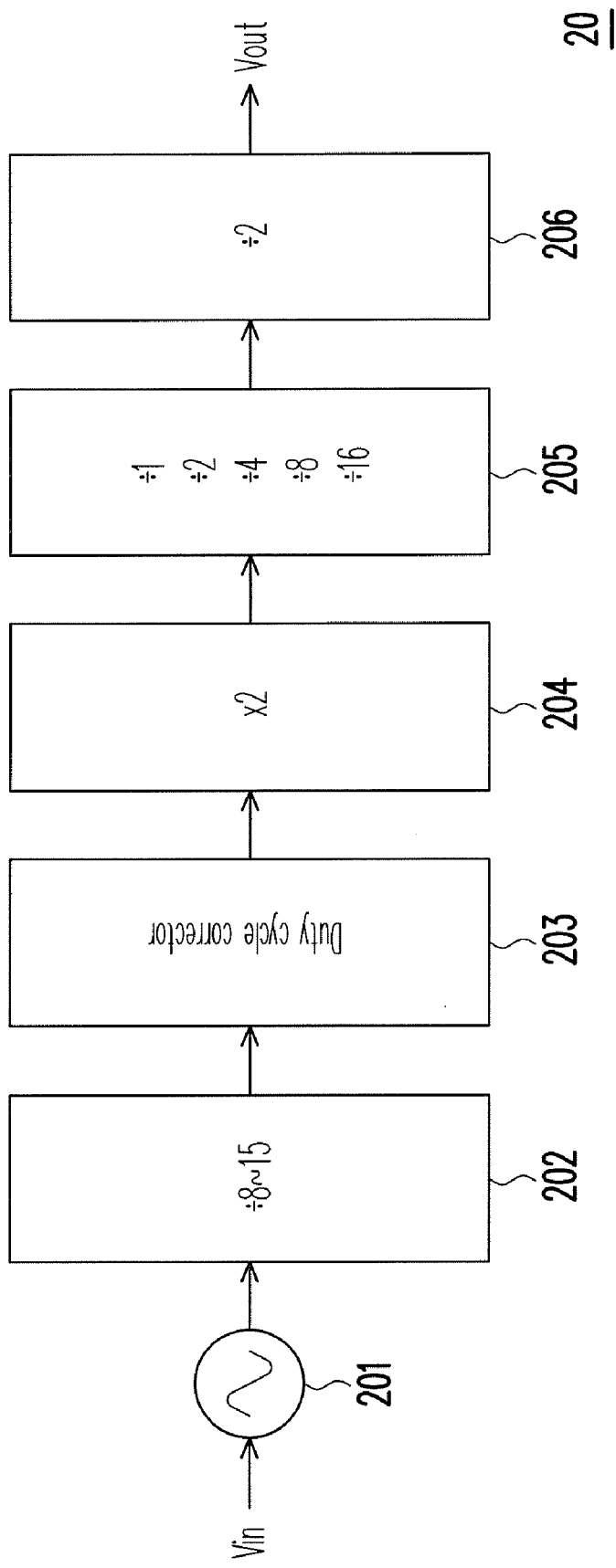
FIG. 2 is a system block diagram of a conventional frequency synthesizer 20.

Reference will now be made in detail to the present preferred embodiments of the invention, examples of which are illustrated in the accompanying drawings. Wherever possible, the same reference numbers are used in the drawings and the description to refer to the same or like parts.

The exemplary embodiment of the present invention provides a frequency synthesizer with low circuit complexity and low power consumption, and the frequency synthesizer is suitable for a tuner. Besides, the exemplary embodiment of the present invention also provides a frequency prescaler applied in the frequency synthesizer. Moreover, the exemplary embodiment of the present invention further provides a frequency synthesizing method based on the frequency synthesizer, wherein the frequency synthesizer adopting the frequency synthesizing method requires only one voltage-controlled oscillator (VCO) so that the chip size of the frequency synthesizer is greatly reduced.

Figure 3:
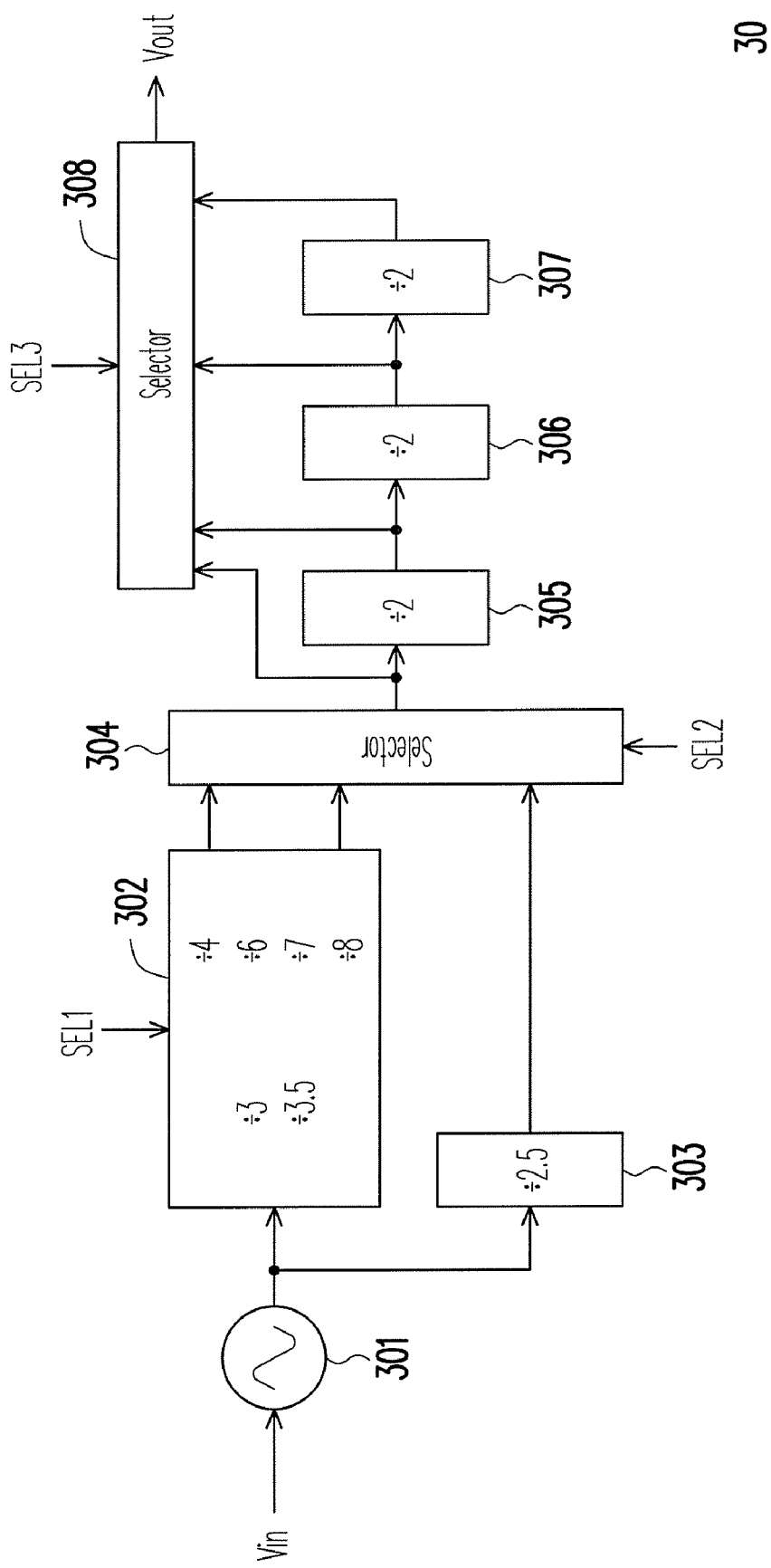
FIG. 3 is a system block diagram of a frequency synthesizer 30 according to an exemplary embodiment of the present invention.

FIG. 3 is a system block diagram of a frequency synthesizer 30 according to an exemplary embodiment of the present invention. Referring to FIG. 3, the frequency synthesizer 30 includes a VCO 301, a frequency prescaler 302, a divide-by-2.5 circuit 303, selectors 304 and 308, and divide-by-2 circuits 305, 306, and 307. The output terminal of the VCO 301 is coupled to the input terminal of the frequency prescaler 302 and the input terminal of the divide-by-2.5 circuit 303. Three input terminals of the selector 304 are respectively coupled to two output terminals of the frequency prescaler 302 and the output terminal of the divide-by-2.5 circuit 303, and the output terminal of the selector 304 is coupled to the input terminal of the divide-by-2 circuit 305. Four input terminals of the selector 308 are respectively coupled to the output terminal of the selector 304 and the output terminals of the divide-by-2 circuits 305~307, the output terminal of the divide-by-2 circuit 305 is coupled to the input terminal of the divide-by-2 circuit 306, and the output terminal of the divide-by-2 circuit 306 is coupled to the input terminal of the divide-by-2 circuit 307.

The VCO 301 generates a first signal according to an input voltage Vin, wherein the frequency of the first signal is between 2.752 GHz and 3.44 GHz. Even though the frequency of the first signal is between 2.752 GHz and 3.44 GHz in the exemplary embodiment of the present embodiment, the frequency range of the first signal is not limited thereto. In other words, the frequency range of the first signal may be changed according to the actual requirement by adjusting the oscillation frequency of the VCO 301.

The frequency prescaler 302 determines the frequency of the first signal to be divided by 3, 3.5, or 4 according to a first selection signal SEL1 to generate a second signal. The frequency prescaler 302 also determines the frequency of the first signal to be divided by 6, 7, or 8 according to the first selection signal SEL1 to generate a third signal. In other words, the frequency of the first signal is 3, 3.5, or 4 times of the frequency of the second signal, and the frequency of the first signal is 6, 7 or 8 times of the frequency of the third signal. The divide-by-2.5 circuit divides the frequency of the first signal by 2.5 to generate a fourth signal. In other words, the frequency of the first signal is 2.5 times of the frequency of the fourth signal.

Then, the selector 304 selects one of the second signal, the third signal, and the fourth signal as a fifth signal according to a second selection signal SEL2. The divide-by-2 circuit 305 divides the frequency of the fifth signal by 2 to generate a sixth signal. The divide-by-2 circuit 306 divides the frequency of the sixth signal by 2 to generate a seventh signal. The divide-by-2 circuit 307 divides the frequency of the seventh signal by 2 to generate an eighth signal. Eventually, the selector 308 selects one of the fifth signal, the sixth signal, the seventh signal, and the eighth signal as an output signal Vout according to a third selection signal SEL3.

If the frequency of the first signal output from the VCO 301 is between 2.752 GHz and 3.44 GHz, the frequency of the output signal Vout is between 50 MHz and 860 MHz. Additionally, in the present exemplary embodiment, the signal on each signal line is a differential signal. Even though a differential signal is represented by a single signal line in the present exemplary embodiment, substantially, the differential signal may also be represented by two signal lines. In the present exemplary embodiment illustrated in FIG. 3, a single signal line is used for representing a differential signal only for the convenience of description.

In addition, it should be mentioned that the frequency synthesizer 30 in the present exemplary embodiment requires only one VCO 301. Accordingly, the chip size of the frequency synthesizer 30 is smaller than that of the conventional frequency synthesizer, and the fabricating cost of the frequency synthesizer 30 is also lower than that of the conventional frequency synthesizer. Moreover, the frequency synthesizer 30 in the present exemplary embodiment does not require any duty cycle corrector (DCC) or multiply-by-2 circuit. Accordingly, the circuit complexity of the frequency synthesizer 30 is lower than that of the conventional frequency synthesizer which requires only one VCO.

It should be noted herein that in the present exemplary embodiment, the divide-by-2 circuits 305, 306, and 307 are located at the back of the frequency prescaler 302. By disposing the divide-by-2 circuits 305, 306, and 307 at the back of the frequency prescaler 302 and the divide-by-2.5 circuit 303, the sixth signal, the seventh signal, and the eighth signal are allowed to have 50% duty cycles. Besides, the frequency prescaler 302 can operate with a high-speed VCO, and the frequency of the input signal is divided by 6, 7, or 8 by the frequency prescaler 302 without first divided by the divide-by-2 circuits 305, 306, and 307. Therefore, both the second signal and the third signal generated by the frequency prescaler 302 have 50% duty cycles, and the frequency synthesizer 30 in the present exemplary embodiment requires only three divide-by-2 circuits 305, 306, and 307.

Figure 4:
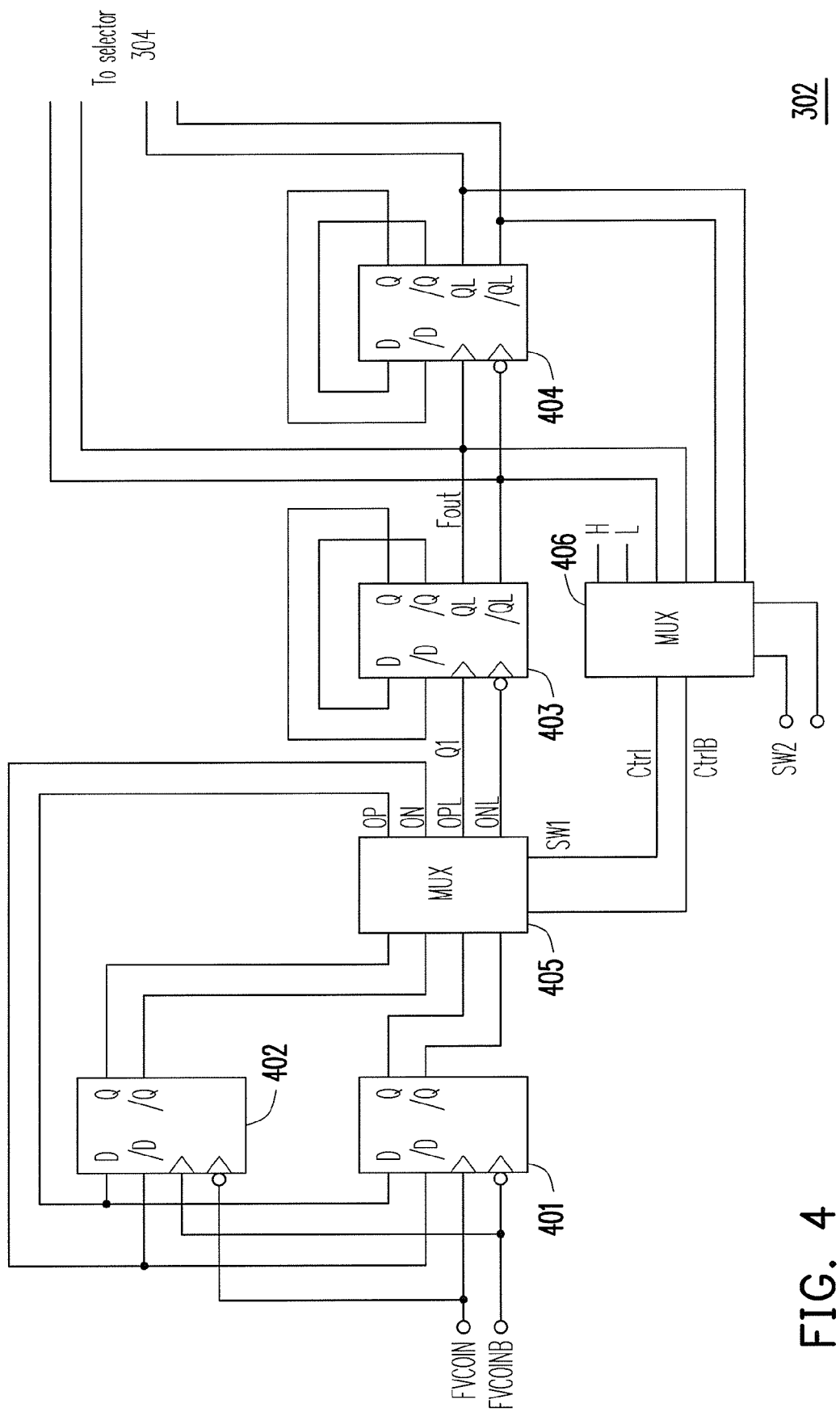
FIG. 4 is a circuit diagram of a frequency prescaler 302 according to an exemplary embodiment of the present invention.

FIG. 4 is a circuit diagram of the frequency prescaler 302 according to an exemplary embodiment of the present invention. Referring to FIG. 4, the frequency prescaler 302 includes D flip-flops 401, 402, 403, and 404 and multiplexers 405 and 406. As described above, the first signal output from the VCO 301 is a differential signal, wherein the positive signal of the first signal is FVCOIN, and the negative signal of the first signal is FVCOINB. The clock signal positive terminal and the clock signal negative terminal of the D flip-flop 401 respectively receive the positive signal FVCOIN and the negative signal FVCOINB of the first signal output from the VCO 301, and the positive output terminal and the negative output terminal of the D flip-flop 401 are respectively coupled to the first positive input terminal and the first negative input terminal of the multiplexer 405. The clock signal negative terminal and the clock signal positive terminal of the D flip-flop 402 are respectively coupled to the positive signal FVCOIN and the negative signal FVCOINB of the first signal output from the VCO 301, and the positive output terminal and the negative output terminal of the D flip-flop 402 are respectively coupled to the second positive input terminal and the second negative input terminal of the multiplexer 405.

The control signal positive input terminal and the control signal negative input terminal of the multiplexer 405 are respectively coupled to the positive output terminal and the negative output terminal of the multiplexer 406, and the positive output terminal OP of the multiplexer 405 is coupled to the positive input terminals of the D flip-flops 402 and 401. The negative output terminal ON of the multiplexer 405 is coupled to the negative input terminals of the D flip-flops 402 and 401, and the level shift positive output terminal OPL and the level shift negative output terminal ONL of the multiplexer 405 are respectively coupled to the clock signal positive terminal and the clock signal negative terminal of the D flip-flop 403. The positive output terminal and the negative output terminal of the D flip-flop 403 are respectively coupled to the negative input terminal and the positive input terminal of the D flip-flop 403. The level shift positive output terminal of the D flip-flop 403 is coupled to the clock signal positive terminal of the D flip-flop 404, the second negative input terminal of the multiplexer 406, and the first negative input terminal of the selector 304. The level shift negative output terminal of the D flip-flop 403 is coupled to the clock signal negative terminal of the D flip-flop 404, the second positive input terminal of the multiplexer 406, and the first positive input terminal of the selector 304.

The positive output terminal and the negative output terminal of the D flip-flop 404 are respectively coupled to the negative input terminal and the positive input terminal of the D flip-flop 404, the level shift positive output terminal of the D flip-flop 404 is coupled to the third negative input terminal of the multiplexer 406 and the second positive input terminal of the selector 304, and the level shift negative output terminal of the D flip-flop 404 is coupled to the third positive input terminal of the multiplexer 406 and the second negative input terminal of the selector 304. The first positive input terminal and the first negative input terminal of the multiplexer 406 respectively receive a high-level voltage H and a low-level voltage L. Besides, the control signal positive input terminal and the control signal negative input terminal of the multiplexer 406 are respectively receive a positive signal of a control signal SW2 and a negative terminal of a control signal SW2.

The D flip-flops 401 and 402 receive the first signal output from the VCO 301. The output signal of the D flip-flop 401 is a positive trigger signal, and the output signal of the D flip-flop 402 is a negative trigger signal. It should be mentioned that the D flip-flop 402 can be removed if the operation frequency range is not considered. In other words, the D flip-flop 402 has to be disposed in the frequency prescaler 302 in order to broaden the range of the operation frequency.

A control signal SW1 received by the multiplexer 405 includes a signal Ctrl on the positive output terminal of the multiplexer 406 and a signal CtrlB on the negative output terminal of the multiplexer 406. In other words, the control signal SW1 is a differential signal formed by the signal Ctrl and the signal CtrlB. The control signal SW1 is substantially a feedback signal, and is used to control the multiplexer 405 to output the signals on the positive output terminal and the negative output terminal of the D flip-flop 401 or those of the D flip-flop 402. In other words, the control signal SW1 can select the positively triggered D flip-flop 401 or the negatively triggered D flip-flop 402.

The control signal SW2 received by the multiplexer 406 is used for determining the control signal SW1 to be a differential signal formed by the high-level voltage H and the low-level voltage L, a differential signal formed on the second positive input terminal and the second negative input terminal of the multiplexer 406, or a differential signal formed on the third positive input terminal and the third negative input terminal of the multiplexer 406, and accordingly the multiplexer 405 is controlled to output the signals on the positive output terminal and the negative output terminal of the D flip-flop 401 or those of the D flip-flop 402, so as to generate the differential signal. The frequency of the differential signal formed on the level shift positive output terminal OPL and the level shift negative output terminal ONL of the multiplexer 405 is the frequency of the first signal divided by 1.5, 1.75, or 2. In short, the control signal SW2 controls the frequency of the first signal to be divided by 3, 3.5, or 4.

The frequency of the differential signal formed on the level shift negative output terminal and the level shift positive output terminal of the D flip-flop 403 is determined according to the control signal SW2, and the frequency of this differential signal is the frequency of the first signal divided by 3, 3.5, or 4. In addition, the frequency of the differential signal formed on the level shift positive output terminal and the level shift negative output terminal of the D flip-flop 404 is determined according to the control signal SW2, and the frequency of this differential signal is the frequency of the first signal divided by 6, 7, or 8. Eventually, the selector 304 determines the frequency of the fifth signal according to the second selection signal SEL2. The frequency of the first signal is 2.5, 3, 3.5, 4, 6, 7, or 8 times of the frequency of the fifth signal. The control signal SW2 is the aforementioned first selection signal SEL1.

It should be noted herein that a differential buffer amplifier may be disposed between the positive output terminal and the negative output terminal of the multiplexer 406 and the control signal positive input terminal and the control signal negative input terminal of the multiplexer 405 to improve the strength of the signal on the positive output terminal and the negative output terminal of the multiplexer 406. However, the present invention is not limited to foregoing differential buffer amplifier. By disposing the differential buffer amplifier, the correctness of the control signal SW1 is ensured, and the accuracy and efficiency of the entire frequency prescaler 302 are improved.

Figure 5A:
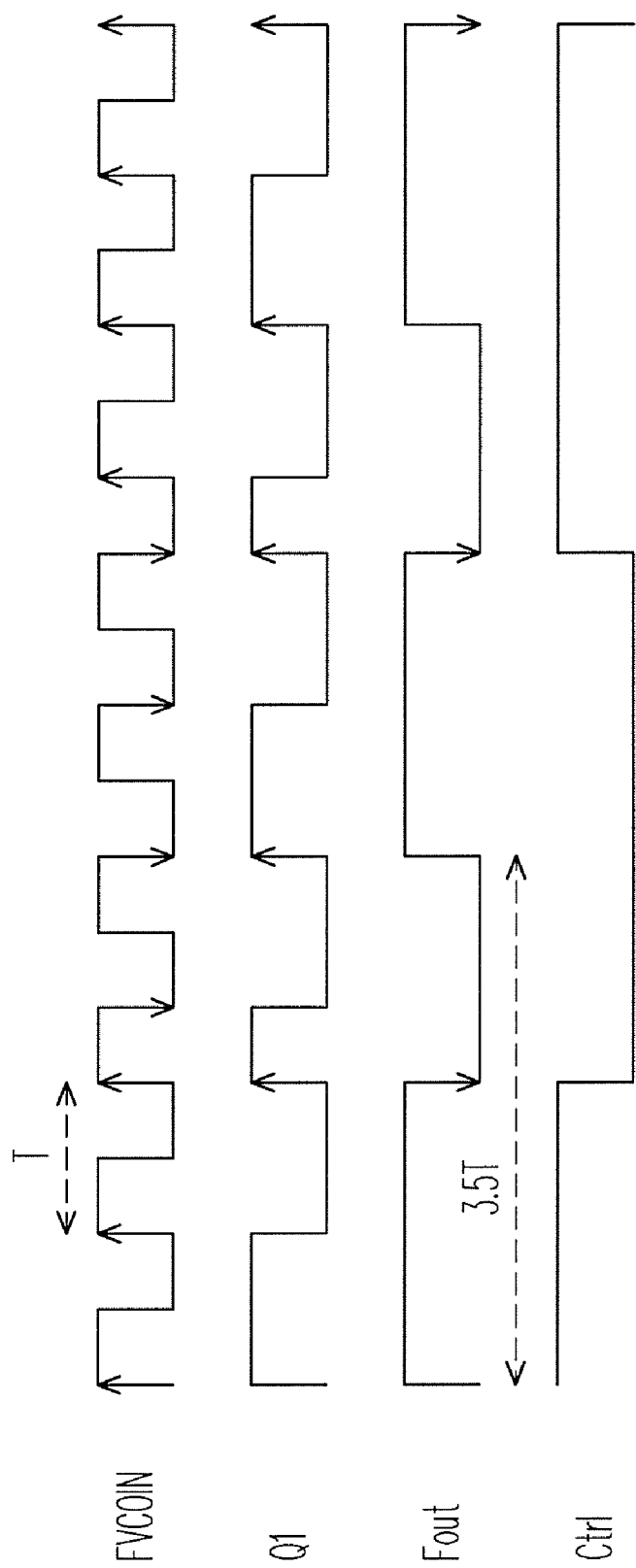
FIG. 5A illustrates signal waveforms when the frequency of a differential signal formed on a level shift negative output terminal and a level shift positive output terminal of a D flip-flop 403 is the frequency of a first signal divided by 3.5.
Figure 5B:
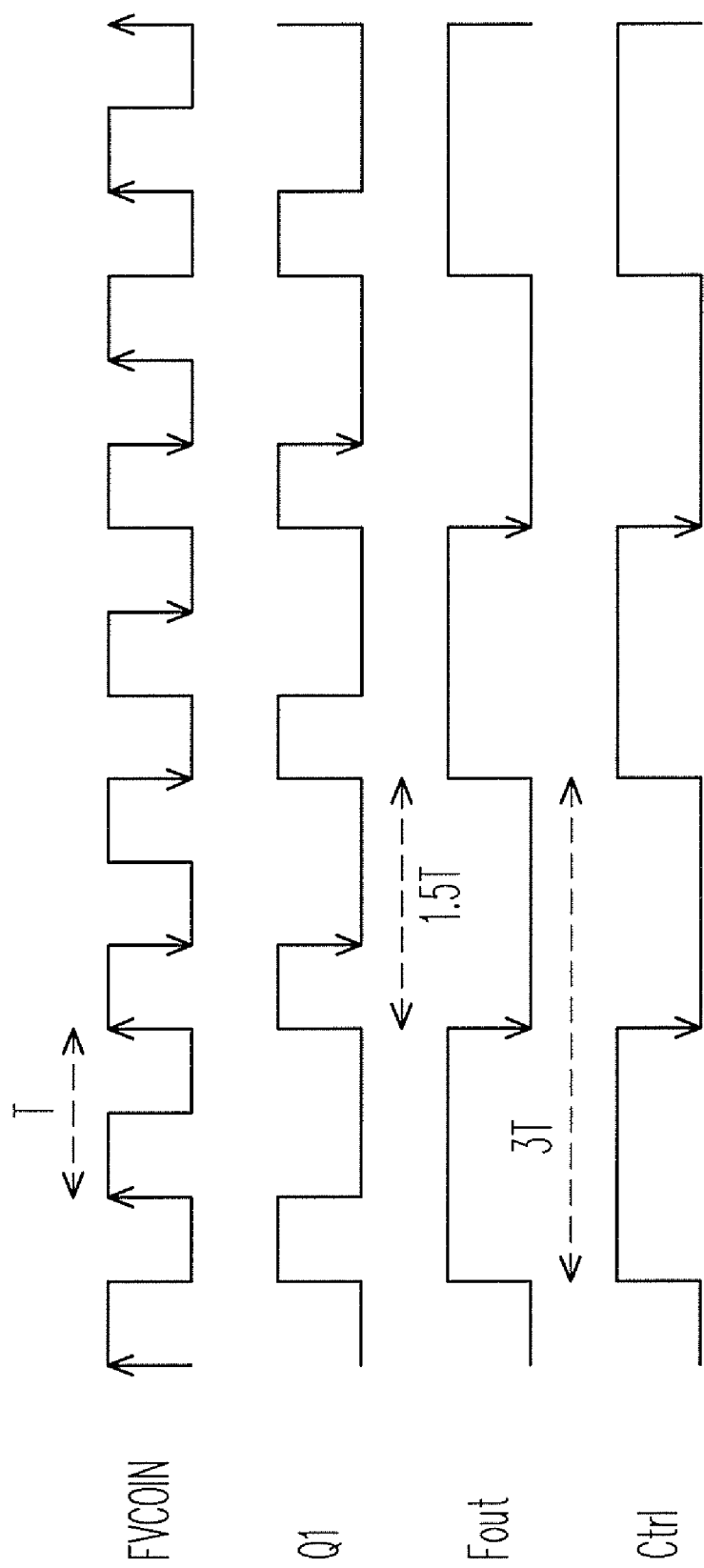
FIG. 5B illustrates signal waveforms when the frequency of the differential signal formed on the level shift negative output terminal and the level shift positive output terminal of the D flip-flop 403 is the frequency of the first signal divided by 3.

FIG. 5A illustrates signal waveforms when the frequency of the differential signal on the level shift negative output terminal and the level shift positive output terminal of the D flip-flop 403 is the frequency of the first signal divided by 3.5, and FIG. 5B illustrates signal waveforms when the frequency of the differential signal on the level shift negative output terminal and the level shift positive output terminal of the D flip-flop 403 is the frequency of the first signal divided by 3. Referring to FIG. 5A and FIG. 5B, the positive signal FVCOIN and the negative signal FVCOINB are reverse to each other so that only the positive signal FVCOIN is illustrated. The signal Q1 is a signal on the level shift positive output terminal OPL of the multiplexer 405, and the signal on the level shift negative output terminal ONL of the multiplexer 405 is reserve to the signal Q1 so that only the signal Q1 is illustrated. The signal Ctrl on the positive output terminal of the multiplexer 406 and the signal CtrlB on the negative output terminal of the multiplexer 406 are reverse to each other so that only the signal Ctrl is illustrated. Besides, the signal Fout is a differential signal formed on the level shift negative output terminal and the level shift positive output terminal of the D flip-flop 403.

As shown in FIG. 5A, when the signal Ctrl is at the high level, the level changes of the signal Q1 are triggered at the positive edges of the signal FVCOIN. In other words, the level of the signal Q1 is changed when the signal FVCOIN goes from the low level up to the high level. When the signal Ctrl is at the low level, the level changes of the signal Q1 are triggered at the negative edges of the signal FVCOIN. In other words, the level of the signal Q1 is changed when the signal FVCOIN goes from the high level down to the low level. The level changes of the signal Fout are triggered at the positive edges of the signal Q1. In other words, the level of the signal Fout is changed when the signal Q1 goes from the low level up to the high level. By adjusting the waveform of the signal Ctrl, the cycle of the signal Fout can be adjusted to be 3.5 times of the cycle of the signal FVCOIN, namely, the frequency of the signal Fout is adjusted to be the frequency of the signal FCVCOIN divided by 3.5. Similarly, referring to FIG. 5B, also by adjusting the waveform of the signal Ctrl, the cycle of the signal Fout can be adjusted to be 3 times of the cycle of the signal FVCOIN, namely, the frequency of the signal Fout is adjusted to be the frequency of the signal FCVCOIN divided by 3.

Figure 6:
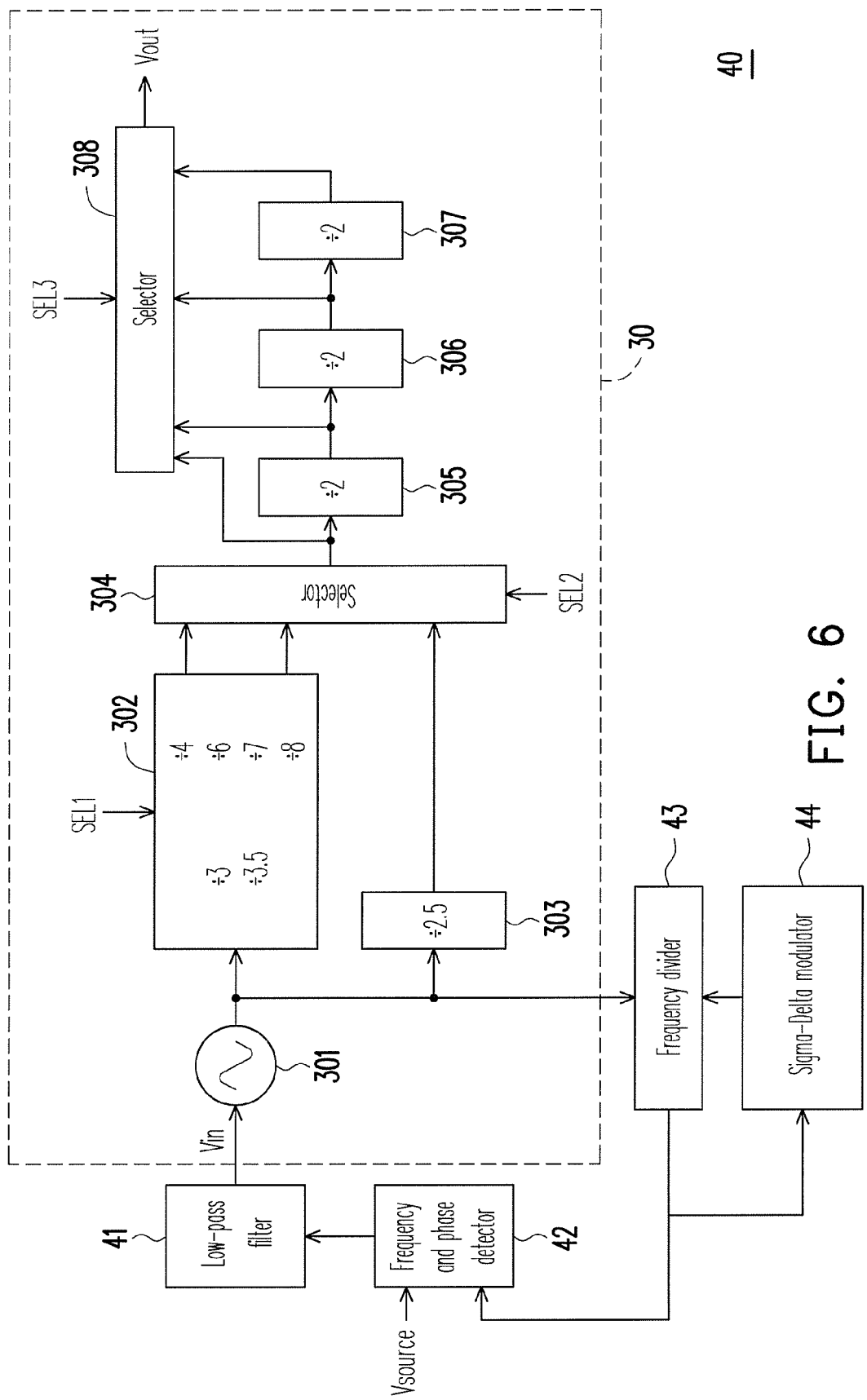
FIG. 6 is a system block diagram illustrating an application of the frequency synthesizer 30 in a tuner 40 according to an exemplary embodiment of the present invention.

FIG. 6 is a system block diagram illustrating an application of the frequency synthesizer 30 in a tuner 40 according to an exemplary embodiment of the present invention. Referring to FIG. 6, the tuner 40 includes the frequency synthesizer 30, a low-pass filter 41, a frequency and phase detector 42, a frequency divider 43 and a Sigma-Delta modulator 44. The frequency synthesizer 30 has the same structure and function as the frequency synthesizer 30 illustrated in FIG. 3, and therefore it will not be described herein.

An input terminal of the frequency divider 43 is coupled to the output terminal of the VCO 301, and another input terminal thereof is coupled to the output terminal of the Sigma-Delta modulator 44. An input terminal of the frequency and phase detector 42 is coupled to an input signal Vsource, and another input terminal thereof is coupled to the output terminal of the frequency divider 43. The input terminal of the low-pass filter 41 is coupled to the output terminal of the frequency and phase detector 42, and the output terminal thereof is coupled to the VCO 301.

The frequency divider 43 generates a ninth signal for the frequency and phase detector 42 according to the first signal and the output signal of the Sigma-Delta modulator 44. Then, the frequency and phase detector 42 generates a tenth signal according to the reference signal Vsource and the ninth signal, wherein the frequency and phase detector 42 further has a charge pump circuit. Next, the low-pass filter 41 filters the tenth signal to generate a voltage Vin.

Even though the application of the frequency synthesizer 30 in the exemplary embodiment of the present invention in the tuner 40 is described above as an example, the application of the frequency synthesizer 30 is not limited thereto.

Figure 7:
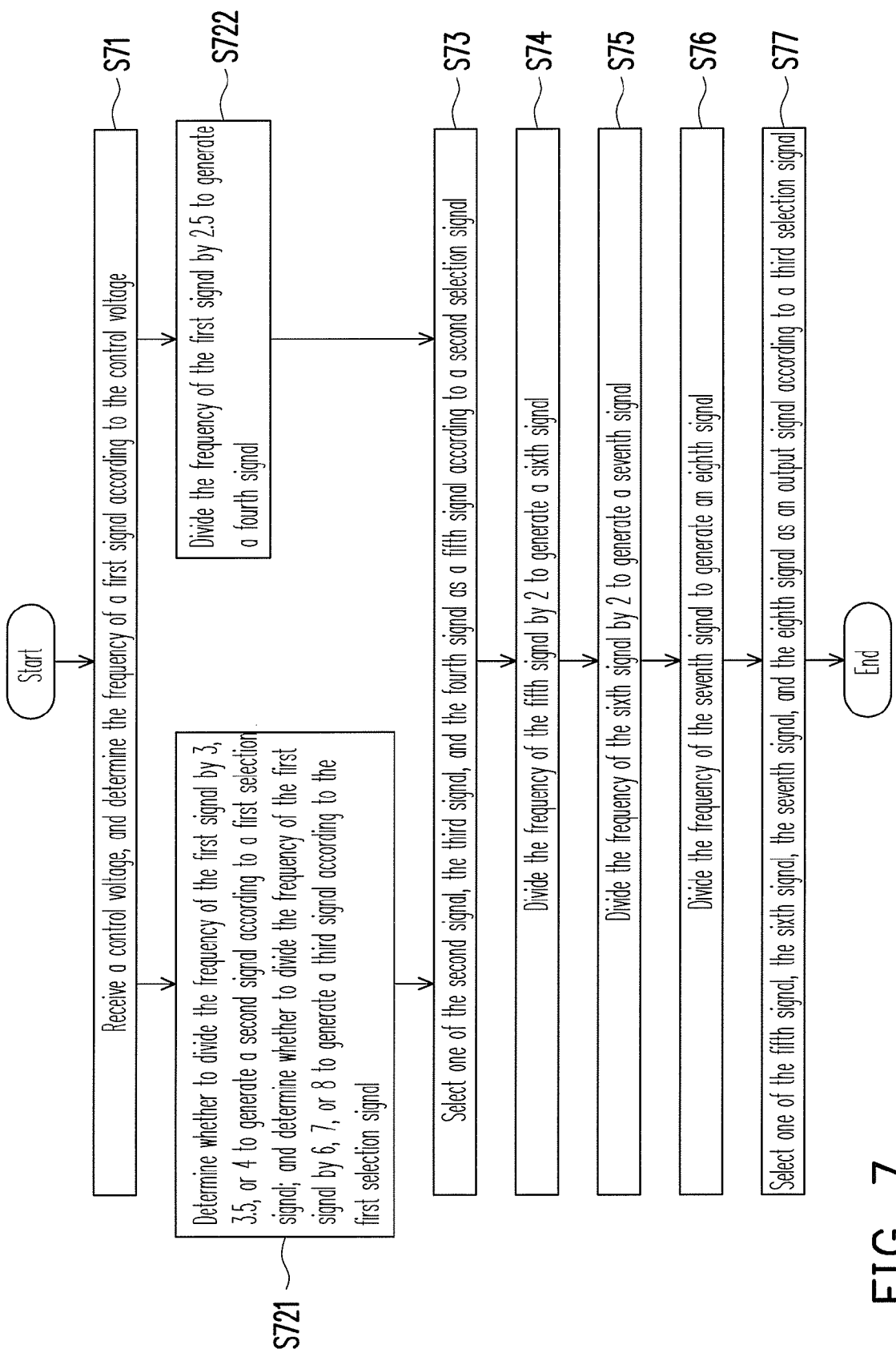
FIG. 7 is a flowchart of a frequency synthesizing method according to an exemplary embodiment of the present invention.

FIG. 7 is a flowchart of a frequency synthesizing method according to an exemplary embodiment of the present invention. Referring to FIG. 7, first, in step S71, a control voltage is received, and the frequency of a first signal is determined according to the control voltage. Then, in step S721, the frequency of the first signal is divided by 3, 3.5, or 4 according to a first selection signal, so as to generate a second signal, and the frequency of the first signal is divided by 6, 7, or 8 according to the first selection signal, so as to generate a third signal. In other words, whether the frequency of the second signal is the frequency of the first signal divided by 3, 3.5, or 4 is determined according to the first selection signal, and whether the frequency of the third signal is the frequency of the first signal divided by 6, 7, or 8 is determined according to the first selection signal. In step S722, the frequency of the first signal is divided by 2.5 to generate a fourth signal, wherein the frequency of the fourth signal is the frequency of the first signal divided by 2.5.

Thereafter, in step S73, one of the second signal, the third signal, and the fourth signal is selected according to a second selection signal to generate a fifth signal. In other words, the fifth signal is determined to be one of the second signal, the third signal, and the fourth signal according to the second selection signal. After that, in step S74, the frequency of the fifth signal is divided by 2 to generate a sixth signal, wherein the frequency of the sixth signal is the frequency of the fifth signal divided by 2. Next, in step S74, the frequency of the sixth signal is divided by 2 to generate a seventh signal, wherein the frequency of the seventh signal is the frequency of the sixth signal divided by 2. After that, in step S74, the frequency of the seventh signal is divided by 2 to generate an eighth signal, wherein the frequency of the eighth signal is the frequency of the sixth signal divided by 2.

Eventually, in step S77, one of the fifth signal, the sixth signal, the seventh signal, and the eighth signal is selected according to a third selection signal to generate an output signal. In other words, the output signal is determined to be one of the fifth signal, the sixth signal, the seventh signal, and the eighth signal according to the third selection signal.

As described above, the frequency synthesizer and the frequency synthesizing method thereof provided by the exemplary embodiment of the present invention require only one VCO to achieve the desired frequency range of an output signal. Thus, the chip size of the frequency synthesizer provided by the exemplary embodiment of the present invention is smaller than that of the conventional frequency synthesizer. Moreover, the frequency of the output signal of foregoing VCO does not need to be multiplied to 7 GHz; instead, the frequency of the output signal of the VCO could be between 2.752 GHz and 3.44 GHz. Thus, both the circuit complexity and the power consumption of the frequency synthesizer are lower than those of the conventional frequency synthesizer.

Furthermore, the exemplary embodiment of the present invention provides a frequency prescaler which can operate with a high-speed VCO, and an output terminal of the frequency prescaler is only connected to three divide-by-2 circuits. Accordingly, a signal output from the frequency prescaler can have a 50% duty cycle without having to dispose any DCC or multiple-by-2 circuit therein. Thus, the circuit complexity of the frequency synthesizer using the frequency prescaler is reduced. The frequency synthesizer provided by the exemplary embodiment of the present invention requires only three divide-by-2 circuits, which are much less than the divide-by-2 circuits required in the conventional frequency synthesizer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A frequency prescaler, suitable for a frequency synthesizer, the frequency prescaler comprising:
   a first D having a clock signal positive input terminal for receiving a positive signal of a first signal, and having a clock signal negative input terminal for receiving a negative signal of the first signal;
   a second D flip-flop, having a clock signal negative input terminal for receiving the positive signal of the first signal, and having a clock signal positive input terminal for receiving the negative signal of the first signal;
   a first multiplexer, having a first positive input terminal and a second positive input terminal respectively coupled to a plurality of positive output terminals of the first D flip-flop and the second D flip-flop, having a first negative input terminal and a second negative input terminal respectively coupled to a plurality of negative output terminals of the first D flip-flop and the second D flip-flop, having a first positive output terminal coupled to a plurality of positive input terminals of the first D flip-flop and the second D flip-flop, and having a first negative output terminal coupled to a plurality of negative input terminals of the first D flip-flop and the second D flip-flop;
   a third D flip-flop, having a clock signal positive terminal and a clock signal negative terminal respectively coupled to a level shift positive output terminal and a level shift negative output terminal of the first multiplexer, having a positive output terminal and a negative input terminal coupled to each other, having a negative output terminal and a positive input terminal coupled to each other, and having a level shift positive output terminal and a level shift negative output terminal respectively coupled to a first negative output terminal and a first positive output terminal of the frequency prescaler;
   a fourth D flip-flop, having a clock signal positive terminal and a clock signal negative terminal respectively coupled to the level shift positive output terminal and the level shift negative output terminal of the third D flip-flop, having a positive output terminal and a negative input terminal respectively coupled to the negative input terminal and a positive input terminal of the fourth D flip-flop, and having a level shift positive output terminal and a level shift negative output terminal respectively coupled to a second positive output terminal and a second negative output terminal of the frequency prescaler; and
   a second multiplexer, having a first positive input terminal and a first negative input terminal respectively coupled to a high-level voltage and a low-level voltage, having a second positive input terminal and a second negative input terminal respectively coupled to the level shift negative output terminal and the level shift positive output terminal of the third D flip-flop, and having a third positive input terminal and a third negative input terminal respectively coupled to the level shift negative output terminal and the level shift positive output terminal of the fourth D flip-flop;
   wherein, the first multiplexer is controlled by a first different control signal, the second multiplexer determines the first differential control signal according to a second different control signal, and outputs the first differential control signal.

2. The frequency prescaler according to claim 1 further comprising:
   a differential buffer amplifier, coupled between the first multiplexer and the second multiplexer, for amplifying the first differential control signal outputted from the second multiplexer.

* * * * *